(12) United States Patent
Tanaka

(10) Patent No.: US 10,439,504 B2
(45) Date of Patent: Oct. 8, 2019

(54) POWER CONVERTER DEVICE AND CONTROL METHOD THEREOF

(71) Applicant: FANUC CORPORATION, Yamanashi (JP)

(72) Inventor: Shunpei Tanaka, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/295,195

(22) Filed: Mar. 7, 2019

(65) Prior Publication Data

US 2019/0280607 A1 Sep. 12, 2019

(30) Foreign Application Priority Data

Mar. 12, 2018 (JP) .................................. 2018-044020

(51) Int. Cl.

| *H02M 5/458* | (2006.01) |
| *H02M 1/42* | (2007.01) |
| *G01R 31/02* | (2006.01) |
| *H02M 7/219* | (2006.01) |
| *H02M 1/00* | (2006.01) |

(52) U.S. Cl.
CPC ........ *H02M 5/4585* (2013.01); *G01R 31/028* (2013.01); *H02M 1/4208* (2013.01); *H02M 7/219* (2013.01); *H02M 2001/0025* (2013.01); *H02M 2001/4283* (2013.01)

(58) Field of Classification Search
CPC .. H02M 5/4585; H02M 1/4208; H02M 7/219; H02M 2001/0025; H02M 2001/4283; G01R 31/028
See application file for complete search history.

(56) References Cited

U.S. PATENT DOCUMENTS

| 2016/0072403 A1* | 3/2016 | Niwa .................. H02M 1/4225 363/89 |
| 2016/0266189 A1* | 9/2016 | Yoshida ............... G01R 31/028 |
| 2017/0149343 A1* | 5/2017 | Bhandarkar .......... H02M 1/126 |
| 2018/0156852 A1* | 6/2018 | Xia .................... G01R 27/2605 |

FOREIGN PATENT DOCUMENTS

| JP | 2004-153978 A | 5/2004 |
| JP | 2016-59181 A | 4/2016 |
| JP | 2016-167948 A | 9/2016 |

* cited by examiner

*Primary Examiner* — Jue Zhang
(74) *Attorney, Agent, or Firm* — Robert P. Michal, Esq.; Carter, DeLuca & Farrell LLP

(57) ABSTRACT

A power converter device includes: a rectifier configured to convert AC power into DC power based on a PWM control signal; a voltage detecting unit configured to detect a voltage of a smoothing capacitor that is connected on a DC side of the rectifier; a capacitance estimating unit configured to estimate capacitance of the smoothing capacitor; a voltage control unit configured to calculate a voltage loop gain from the estimated capacitance and generate a control voltage from the voltage loop gain and an error between a command voltage and the detected voltage; and a PWM control unit configured to generate the PWM control signal by using the control voltage and control the rectifier.

14 Claims, 5 Drawing Sheets

POWER CONVERTER DEVICE AND CONTROL METHOD THEREOF

CROSS-REFERENCE TO RELATED APPLICATION

This application is based upon and claims the benefit of priority from Japanese Patent Application No. 2018-044020 filed on Mar. 12, 2018, the contents of which are incorporated herein by reference.

BACKGROUND OF THE INVENTION

Field of the Invention

The present invention relates to a power converter device for converting AC (alternating-current) power supplied from a three-phase AC power supply into DC (direct-current) power, and to a control method thereof.

Description of the Related Art

A power converter device is disclosed which includes a rectifier having a switching element and a PWM (Pulse Width Modulation) control unit that generates a PWM control signal for controlling switching operation of the switching element of the rectifier (Japanese Laid-Open Patent Publication No. 2016-059181).

The PWM control unit of the technique disclosed in Japanese Laid-Open Patent Publication No. 2016-059181 generates the PWM control signal from an AC voltage value and AC current value on the AC power supply side of the rectifier and a DC voltage of a smoothing capacitor connected on the DC side of the rectifier.

SUMMARY OF THE INVENTION

In general, feedback control is employed for PWM control of a rectifier, and gains (loop gains) of the feedback control are dependent on the capacitance of the smoothing capacitor. Accordingly, it is necessary to correctly know the capacitance of the smoothing capacitor.

However, it is generally known that the smoothing capacitors are components that are subject to aging, i.e., components whose capacitance decreases as they are repeatedly charged and discharged. Further, for the purpose of supplying backup energy for a power failure, an external capacitor module may sometimes be connected on the DC side of the rectifier separately from the smoothing capacitor, in which case the apparent capacitance of the smoothing capacitor increases.

In this way, there is a concern that the voltage of the smoothing capacitor may not be controlled suitably when the capacitance of the smoothing capacitor varies.

Accordingly, an object of the present invention is to provide a power converter device that can suitably control the voltage of a smoothing capacitor even when the capacitance of the smoothing capacitor varies, and a control method thereof.

According to a first aspect of the present invention, a power converter device configured to convert alternating-current power supplied from a three-phase alternating-current power supply into direct-current power includes: a rectifier configured to convert the alternating-current power into the direct-current power based on a pulse width modulation control signal; a voltage detecting unit configured to detect a voltage of a smoothing capacitor that is connected on a direct-current side of the rectifier; a capacitance estimating unit configured to estimate capacitance of the smoothing capacitor; a voltage control unit configured to calculate a voltage loop gain from the estimated capacitance and generate a control voltage from the voltage loop gain and an error between a command voltage and the detected voltage; and a pulse width modulation control unit configured to generate the pulse width modulation control signal by using the control voltage and control the rectifier.

According to a second aspect of the present invention, in a control method of a power converter device that is configured to convert alternating-current power supplied from a three-phase alternating-current power supply into direct-current power, the power converter device includes: a rectifier configured to convert the alternating-current power into the direct-current power based on a pulse width modulation control signal; and a voltage detecting unit configured to detect a voltage of a smoothing capacitor that is connected on a direct-current side of the rectifier, and the control method includes: a capacitance estimating step of estimating capacitance of the smoothing capacitor; a calculating step of calculating a voltage loop gain from the estimated capacitance; a generating step of generating a control voltage from the voltage loop gain and an error between a command voltage and the detected voltage; and a pulse width modulation control step of generating the pulse width modulation control signal by using the control voltage and controlling the rectifier.

According to the present invention, the voltage loop gain is calculated from the estimated capacitance of the smoothing capacitor, and the PWM control signal is generated based on the calculated voltage loop gain. It is therefore possible to suitably control the voltage of the smoothing capacitor even when the capacitance of the smoothing capacitor varies.

The above and other objects, features, and advantages of the present invention will become more apparent from the following description when taken in conjunction with the accompanying drawings, in which a preferred embodiment of the present invention is shown by way of illustrative example.

DESCRIPTION OF THE PREFERRED EMBODIMENTS

A power converter device and a control method thereof according to the present invention will be described in detail below in conjunction with a preferred embodiment with reference to the accompanying drawings.

Embodiment

Figure 1:
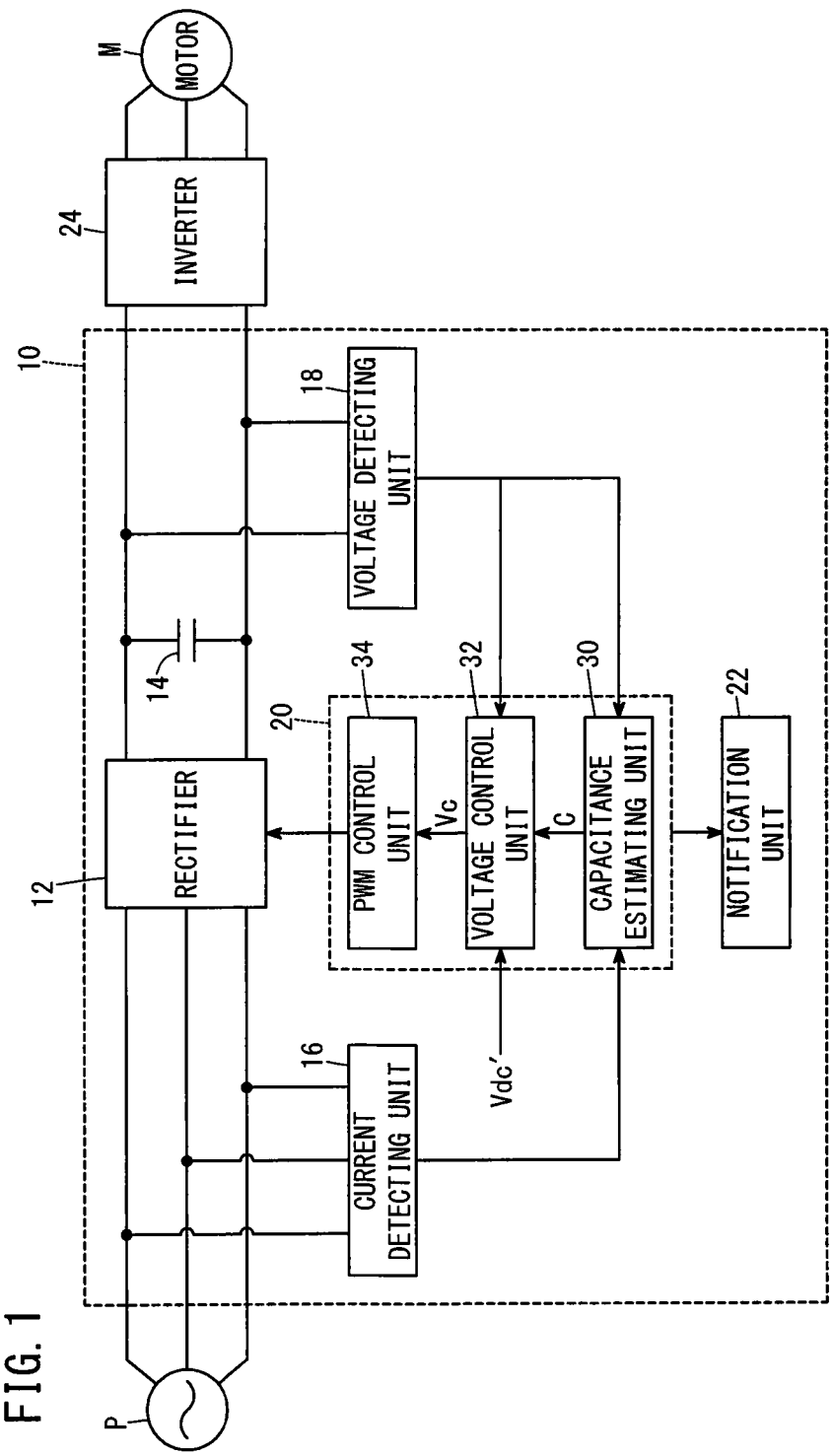
FIG. 1 is a schematic diagram illustrating the configuration of a power converter device according to an embodiment.

FIG. 1 is a schematic diagram illustrating the configuration of a power converter device 10 according to an embodiment. The power converter device 10 is configured to convert AC (alternating-current) power supplied from a three-phase AC power supply P into DC (direct-current) power. The power converter device 10 includes a rectifier 12, a smoothing capacitor 14, a current detecting unit 16, a voltage detecting unit 18, a control unit 20, and a notification unit 22.

The rectifier 12 is configured to convert AC power supplied from the three-phase AC power supply P into DC power based on a PWM (pulse width modulation) control signal. More specifically, the rectifier 12 includes a switching element, and the switching element is switched based on the PWM control signal to convert the AC power supplied from the three-phase AC power supply P into DC power. The switching element can be, for example, an IGBT, power MOSFET, bipolar transistor, or thyristor.

The smoothing capacitor 14 is connected on the DC side of the rectifier 12 to smooth the DC power converted at the rectifier 12. In this embodiment, the voltage of the smoothing capacitor 14 (hereinafter referred to as capacitor voltage) is converted by an inverter 24 into AC voltage for driving a motor M and outputted from the inverter 24 to the motor M.

The current detecting unit 16 is configured to detect electric current flowing from the three-phase AC power supply P to the rectifier 12 and output the detected current to the control unit 20. The voltage detecting unit 18 is configured to detect the capacitor voltage of the smoothing capacitor 14 and output the detected capacitor voltage to the control unit 20.

The control unit 20 is configured to control the rectifier 12 by performing a feedback control such that the capacitor voltage detected by the voltage detecting unit 18 comes closer to a command voltage Vdc'. The control unit 20 includes a capacitance estimating unit 30, a voltage control unit 32, and a PWM control unit 34.

The capacitance estimating unit 30 is configured to estimate capacitance C of the smoothing capacitor 14. The capacitance estimating unit 30 of this embodiment estimates the capacitance C of the smoothing capacitor 14 on the basis of the current detected by the current detecting unit 16 and the capacitor voltage detected by the voltage detecting unit 18.

Figure 2:
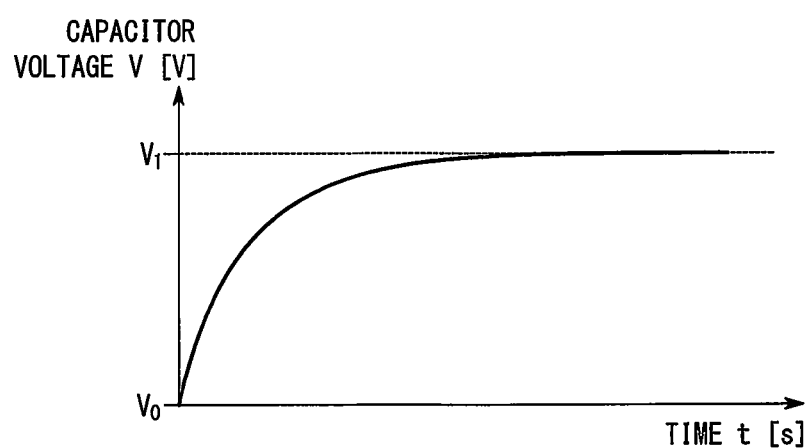
FIG. 2 is a graph illustrating a voltage variation of a smoothing capacitor.

As shown in FIG. 2, for example, the capacitance C of the smoothing capacitor 14 can be estimated from a capacitor voltage $V_0$ at the time when power is turned on, a capacitor voltage $V_1$ at the time when it converges at a steady-state value, and a stored charge that is stored at the smoothing capacitor 14 between the two time points. As to the stored charge, equation (1) below holds, where the charge at the time of power-on is denoted by $Q_0$, the charge at the time of convergence is denoted by $Q_1$, and the current detected by the voltage detecting unit 18 from the time of power-on to the time of convergence is denoted by I.

$$Q_1 - Q_0 = \int I dt = C\Delta V = C(V_1 - V_0) \quad (1)$$

Rearranging equation (1) above focusing on the capacitance C yields equation (2) below.

$$C = \frac{\int I dt}{V_1 - V_0} \quad (2)$$

Thus, the capacitance estimating unit 30 can estimate the capacitance C of the smoothing capacitor 14 by using equation (2) above. Note that the method of estimating the capacitance C of the smoothing capacitor 14 using equation (2) above has been described by way of example, and other estimating methods can be employed. After estimating the capacitance C of the smoothing capacitor 14, the capacitance estimating unit 30 outputs the estimated capacitance C of the smoothing capacitor 14 to the voltage control unit 32.

The voltage control unit 32 performs a feedback control by using PI (proportional integral) control. The voltage control unit 32 of this embodiment calculates a proportional gain $K_p$ and an integral gain $K_i$ in accordance with the capacitance C of the smoothing capacitor 14 estimated by the capacitance estimating unit 30. A method for calculating the proportional gain $K_p$ and integral gain $K_i$ will be described later.

After calculating the proportional gain $K_p$ and integral gain $K_i$, the voltage control unit 32 determines whether the calculated proportional gain $K_p$ and integral gain $K_i$ are within given ranges respectively. If the voltage control unit 32 determines that at least one of the proportional gain $K_p$ and integral gain $K_i$ is not within the given range, the voltage control unit 32 retries calculation of the proportional gain $K_p$ and integral gain $K_i$.

When the voltage control unit 32 has determined that both of the calculated proportional gain $K_p$ and integral gain $K_i$ are within the given ranges before the number of retries exceeds a given number of times, the voltage control unit 32 settles those proportional gain $K_p$ and integral gain $K_i$ as appropriate voltage loop gains. In this case, the voltage control unit 32 generates a control voltage Vc from the proportional gain $K_p$ and integral gain $K_i$ thus determined and an error between the capacitor voltage detected by the voltage detecting unit 18 and the command voltage Vdc', and outputs the generated control voltage Vc to the PWM control unit 34.

On the other hand, when the voltage control unit 32 cannot determine that both of the calculated proportional gain $K_p$ and integral gain $K_i$ are within the given ranges before the number of retries exceeds the given number of times, the voltage control unit 32 generates an abnormality signal and outputs it to the PWM control unit 34 and the notification unit 22.

The PWM control unit 34 generates the PWM control signal by using the control voltage Vc outputted from the voltage control unit 32 and controls the rectifier 12. When the abnormality signal is outputted from the voltage control unit 32, the PWM control unit 34 stops the control of the rectifier 12 that is based on the PWM control signal.

The notification unit 22 is configured to notify that the smoothing capacitor 14 is abnormal. The notification unit 22 notifies that the smoothing capacitor 14 is abnormal when the abnormality signal is supplied from the voltage control unit 32.

A specific method by which the notification unit 22 gives notification can be, for example, a method in which it is displayed on a display unit, a method in which an alarm sound is generated from a sound generator, a method in which light is generated from a warning lamp, etc. The notification unit 22 may include a display unit, a sound generator or a warning lamp, or may be configured to control an external display unit, an external sound generator or an external warning lamp. Also, the notification unit 22 may give notification by using two or more notification methods.

Figure 3:
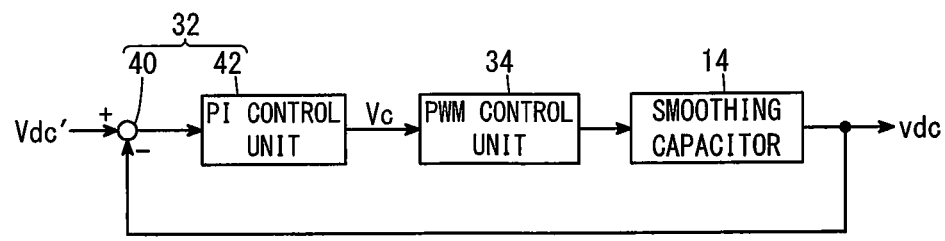
FIG. 3 is a diagram illustrating a voltage loop of the power converter device of FIG. 1.

Next, a method by which the voltage control unit 32 calculates the proportional gain $K_p$ and integral gain $K_i$ will be described. FIG. 3 is a diagram illustrating a voltage loop of the power converter device 10. Specifically, the voltage loop shown in FIG. 3 is a feedback loop of voltage at the voltage control unit 32, PWM control unit 34, and smoothing capacitor 14. Note that, for the sake of simplicity, FIG. 3 assumes that there are no disturbance loads.

In FIG. 3, the voltage control unit 32 is divided into an output unit 40 that outputs the error between the command voltage Vdc' and feedback voltage (capacitor voltage) vdc, and a PI control unit 42 that generates the control voltage Vc using the error outputted from the output unit 40.

When the transfer function of the voltage loop shown in FIG. 3 is denoted by G(s), the angular frequency of the voltage loop is denoted by ω [rad/s], and the damping coefficient (attenuation coefficient) is denoted by ζ, then equation (3) below holds.

$$G(s) = \frac{K_p s + K_i}{Cs^2 + K_p s + K_i} = \frac{K'_p s + K'_i}{s^2 + K'_p s + K'_i} = \frac{\omega s + \left(\frac{\omega}{2\zeta}\right)^2}{s^2 + \omega s + \left(\frac{\omega}{2\zeta}\right)^2} \quad (3)$$

When the frequency is taken as B, in relation to the angular frequency ω, the frequency B is ω/2π, and K'$_p$=Kp/C=ω) from equation (3) above, and then the frequency B can be represented as shown by equation (4) below.

$$B = \frac{K_p}{2\pi C} \quad (4)$$

Further, from equation (3) above, K'$_i$=K$_i$/C=(ω/2π)$^2$, and ω=Kp/C, and then the damping coefficient can be represented as shown below as equation (5).

$$\zeta = \frac{K_p}{2\sqrt{K_i C}} \quad (5)$$

By using equations (4) and (5) above, the voltage control unit 32 calculates the proportional gain K$_p$ and integral gain K$_i$ according to the capacitance C of the smoothing capacitor 14 estimated by the capacitance estimating unit 30 such that both of the frequency B and damping coefficient ζ satisfy predetermined set values.

Specifically, the voltage control unit 32 calculates the proportional gain K$_p$ and integral gain K$_i$ such that the proportional gain K$_p$ and integral gain K$_i$ become smaller as the capacitance C estimated by the capacitance estimating unit 30 is smaller. The method of calculating the proportional gain K$_p$ and integral gain K$_i$ by using above equations (4) and (5) has been described by way of example, and other calculating methods may be employed.

Figure 4:
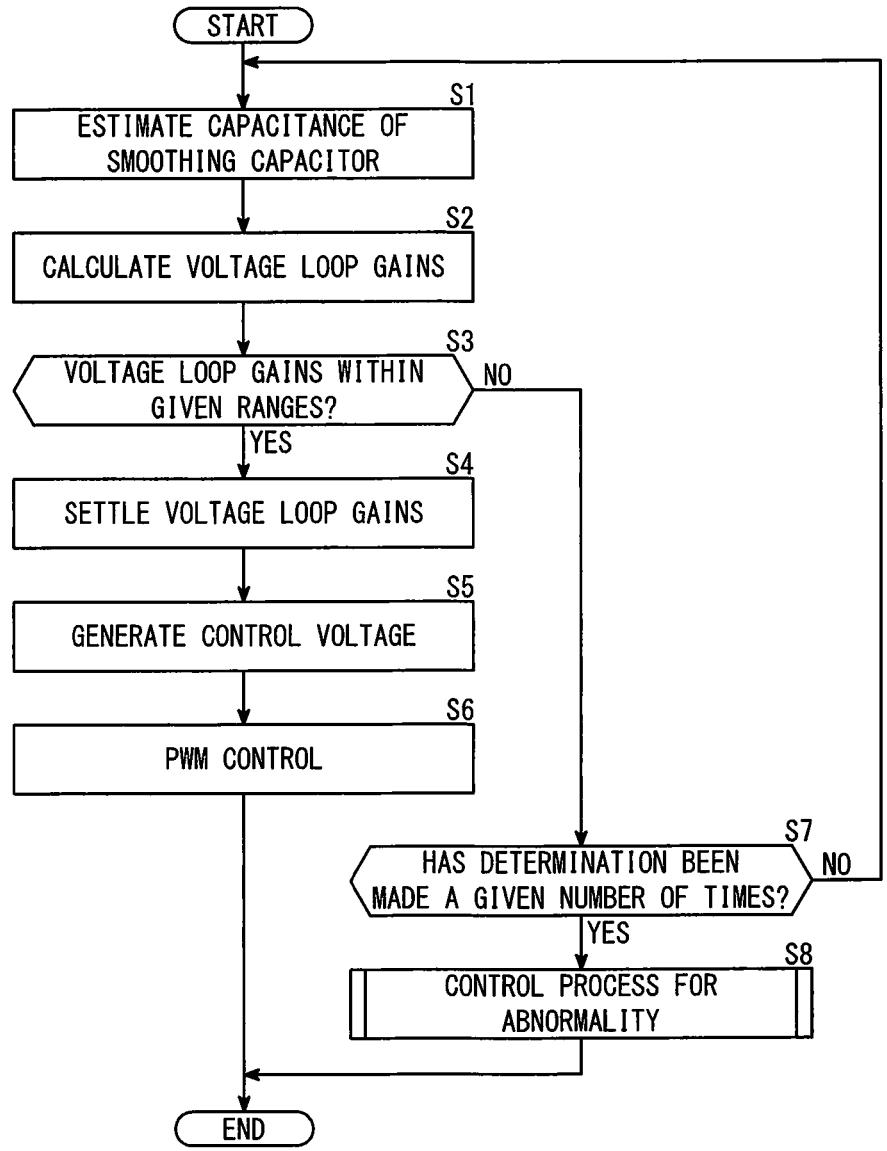
FIG. 4 is a flowchart illustrating a processing procedure of the control unit of FIG. 1.

Next, a control method of the power converter device 10 will be described. FIG. 4 is a flowchart illustrating a processing procedure of the control unit 20.

At step S1, the capacitance estimating unit 30 estimates the capacitance C of the smoothing capacitor 14, and the process proceeds to step S2. At step S2, from the capacitance C of the smoothing capacitor 14 estimated at step S1, the voltage control unit 32 calculates the proportional gain K$_p$ and integral gain K$_i$ as voltage loop gains, and the process proceeds to step S3.

At step S3, the voltage control unit 32 determines whether the proportional gain K$_p$ and integral gain K$_i$ calculated as voltage loop gains at step S2 are within the given ranges, respectively.

Here, if the voltage control unit 32 determines at step S3 that the proportional gain K$_p$ and integral gain K$_i$ are respectively within the given ranges, the process proceeds to step S4. Then, the voltage control unit 32 settles those proportional gain K$_p$ and integral gain K$_i$ as appropriate voltage loop gains and the process proceeds to step S5.

At step S5, the voltage control unit 32 generates the control voltage Vc on the basis of the proportional gain K$_p$ and integral gain K$_i$ that have been determined to be appropriate voltage loop gains at step S4, and the process proceeds to step S6. At step S6, the PWM control unit 34 generates the PWM control signal by using the control 12.

In this way, the control unit 20 calculates the voltage loop gains from the estimated capacitance C of the smoothing capacitor 14 and generates the PWM control signal based on the voltage loop gains, so that the capacitor voltage can be appropriately controlled even if the capacitance C of the smoothing capacitor 14 varies.

On the other hand, if the voltage control unit 32 has determined at step S3 that at least one of the proportional gain K$_p$ and integral gain K$_i$ is not within the given range, the voltage control unit 32 proceeds to step S7 to determine whether the determination of step S3 has been made a given number of times. If the determination of step S3 has not been made the given number of times, the voltage control unit 32 returns to step S1 to retry the calculation of the proportional gain K$_p$ and integral gain K$_i$; if the determination of step S3 has been made the given number of times, the voltage control unit 32 proceeds to step S8.

At step S8, the control unit 20 executes a control process for abnormality. That is to say, the voltage control unit 32 generates the abnormality signal and outputs the generated abnormality signal to the PWM control unit 34 and notification unit 22. Based on the abnormality signal supplied from the voltage control unit 32, the PWM control unit 34 stops the control of the rectifier 12 that is based on the PWM control signal. The notification unit 22 notifies that the smoothing capacitor 14 is abnormal based on the abnormality signal supplied from the voltage control unit 32.

As described so far, when the control unit 20 cannot calculate the proportional gain K$_p$ and integral gain K$_i$ within the given ranges even after having retried the given number of times, the control unit 20 stops the control of the rectifier 12 and notifies that the smoothing capacitor 14 is abnormal. In this way, the control unit 20 can give an operator a chance for replacing the smoothing capacitor 14 while avoiding a situation where the rectifier 12 keeps operating unstably.

[Modifications]

The above embodiment has been described as an example of the present invention, and the technical scope of the present invention is not limited to the scope described in the embodiment above. Various modifications or improvements can of course be applied to the above-described embodiment. It is clear from the recitation of claims that embodiments thus modified or improved in various ways are included in the technical scope of the present invention.

<Modification 1>

Figure 5:
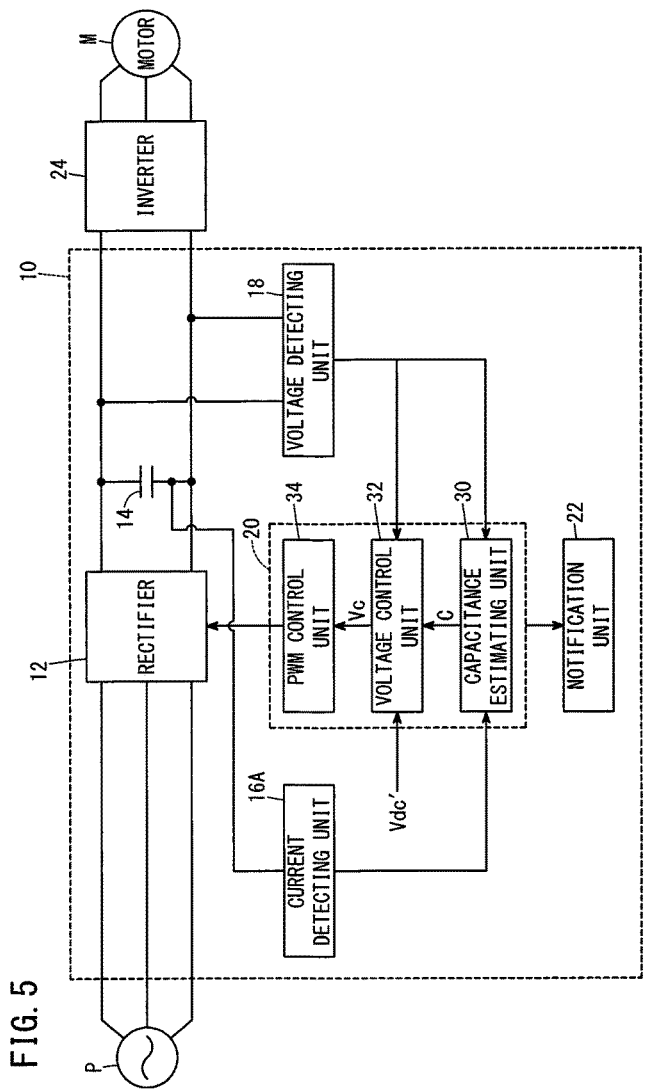
FIG. 5 is a schematic diagram illustrating the configuration of a power converter device according to modification 1.

FIG. 5 is a schematic diagram illustrating the configuration of a power converter device 10 according to modification 1. In FIG. 5, constituent components that are equivalent to those described in the embodiment above will be labeled using the same reference numerals. The descriptions of the similar components will not be repeated in modification 1.

The power converter device 10 of modification 1 differs from the above-described embodiment in that it includes a current detecting unit 16A that detects current flowing from the rectifier 12 to the smoothing capacitor 14, in place of the current detecting unit 16 that detects current flowing from the three-phase AC power supply P to the rectifier 12.

Modification 1 thus differs from the above-described embodiment as to where the current is detected, but the capacitance estimating unit 30 can estimate the capacitance C of the smoothing capacitor 14 in the same way as that in the embodiment above on the basis of the current detected by the current detecting unit 16A and the capacitor voltage detected by the voltage detecting unit 18.

<Modification 2>

In the above-described embodiment, the capacitance estimating unit 30 estimates the capacitance C of the smoothing capacitor 14 by using equation (2) above. However, for example, the capacitance estimating unit 30 may estimate the capacitance C of the smoothing capacitor 14 by using the estimating methods disclosed in Japanese Laid-Open Patent Publication No. 2016-059181 or Japanese Laid-Open Patent Publication No. 2016-167948.

Further, for example, the capacitance estimating unit 30 may estimate the capacitance C of the smoothing capacitor 14 based on electric power (an output value to the motor M) that has been calculated from the current detected by the current detecting unit 16 or 16A and the voltage detected by the voltage detecting unit 18.

In short, the estimating method of the capacitance estimating unit 30 is not particularly limited, and various methods are widely applicable.

<Modification 3>

In the above-described embodiment, the voltage control unit 32 applies a feedback control by using PI control, but a feedback control may be performed by using PID control, a feedback control may be performed by using P control, and a feedback control may be performed by using PD control. In short, a feedback control can be performed by using at least one of the P (proportional) control, I (integral) control, and D (derivative) control.

When the PID control is employed, the voltage loop gains are the proportional gain $K_p$, integral gain $K_i$, and derivative gain $K_d$. When the P control is employed, the voltage loop gain is the proportional gain $K_p$. When the PD control is employed, the voltage loop gains are the proportional gain $K_p$ and derivative gain $K_d$.

<Modification 4>

In the above-described embodiment, an external capacitor module is not connected on the DC side of the rectifier 12. However, such a capacitor module may be connected. When an external capacitor module is connected on the DC side of the rectifier 12, the capacitance estimating unit 30 estimates the total capacitance of the smoothing capacitor 14 and capacitor module. In this case, when the abnormality signal is supplied from the voltage control unit 32, the notification unit 22 notifies that the smoothing capacitor 14 or the capacitor module is abnormal.

In this way, even when an external capacitor module is connected on the DC side of the rectifier 12, it is possible to provide an operator with a chance for replacing the smoothing capacitor 14 or capacitor module while avoiding the situation where the rectifier 12 keeps operating unstably.

<Modification 5>

The above-described embodiment and modifications 1 to 4 may be arbitrarily combined within a range where no inconsistency occurs.

[Technical Ideas]

Technical ideas that can be grasped from the above-described embodiment and modifications will be described below.

<First Technical Idea>

The power converter device (10) is configured to convert alternating-current power supplied from a three-phase alternating-current power supply (P) into direct-current power. The power converter device (10) includes: a rectifier (12) configured to convert the alternating-current power into the direct-current power based on a pulse width modulation control signal; a voltage detecting unit (18) configured to detect a voltage of a smoothing capacitor (14) that is connected on a direct-current side of the rectifier (12); a capacitance estimating unit (30) configured to estimate capacitance (C) of the smoothing capacitor (14); a voltage control unit (32) configured to calculate a voltage loop gain from the estimated capacitance (C) and generate a control voltage (Vc) from the voltage loop gain and an error between a command voltage (Vdc') and the detected voltage; and a pulse width modulation control unit (34) configured to generate the pulse width modulation control signal by using the control voltage (Vc) and control the rectifier (12).

In the power converter device (10), the voltage loop gain is calculated from the estimated capacitance (C) of the smoothing capacitor (14), and the pulse width modulation control signal is generated based on the calculated voltage loop gain. It is therefore possible to control the voltage of the smoothing capacitor (14) appropriately even if the capacitance (C) of the smoothing capacitor (14) varies.

The voltage control unit (32) may be configured to output an abnormality signal when the voltage control unit (32) determines that the voltage loop gain is not within a given range. It is then possible to give an operator a chance for replacing the smoothing capacitor (14).

The capacitance estimating unit (30) may be configured to estimate the capacitance (C) until the voltage control unit (32) determines that the voltage loop gain is within the given range, until a determination that the voltage loop gain is not within the given range is made a given number of times by the voltage control unit (32), and the voltage control unit (32) may be configured to output the abnormality signal when the determination that the voltage loop gain is not within the given range has been made the given number of times by the voltage control unit (32). It is then possible to suppress output of the abnormality signal when a voltage loop gain outside the given range is calculated due to an accidental factor and the like.

The pulse width modulation control unit (34) may be configured to stop control of the rectifier (12) that is based on the pulse width modulation control signal, when the voltage control unit (32) determines that the voltage loop gain is not within the given range. It is then possible to avoid a state where the rectifier (12) keeps operating unstably.

The voltage control unit (32) may be configured to calculate the voltage loop gain such that the voltage loop gain becomes smaller as the estimated capacitance (C) is smaller. It is then possible to appropriately control the voltage of the smoothing capacitor (14).

The power converter device (10) may further include a current detecting unit (16, 16A) configured to detect a current flowing from the three-phase alternating-current power supply (P) to the rectifier (12), or a current flowing from the rectifier (12) to the smoothing capacitor (14), and the capacitance estimating unit (30) may be configured to estimate the capacitance (C) based on the detected current and the detected voltage, or electric power calculated from the current and the voltage. This facilitates accurate estimation of the capacitance (C).

The voltage loop gain may include: a proportional gain ($K_p$) and an integral gain ($K_i$); or the proportional gain ($K_p$), the integral gain ($K_i$), and a derivative gain ($K_d$).

<Second Technical Idea>

The control method of a power converter device (10) is a control method of a power converter device (10) that is configured to convert alternating-current power supplied from a three-phase alternating-current power supply (P) into direct-current power. The power converter device (10) includes: a rectifier (12) configured to convert the alternating-current power into the direct-current power based on a pulse width modulation control signal; and a voltage detecting unit (18) configured to detect a voltage of a smoothing capacitor (14) that is connected on a direct-current side of the rectifier (12). The control method of the power converter device (10) includes: a capacitance estimating step (S1) of estimating capacitance (C) of the smoothing capacitor (14); a calculating step (S2) of calculating a voltage loop gain from the estimated capacitance (C); a generating step (S5) of generating a control voltage (Vc) from the voltage loop gain and an error between a command voltage (Vdc') and the detected voltage; and a pulse width modulation control step (S6) of generating the pulse width modulation control signal by using the control voltage (Vc) and controlling the rectifier (12).

In the control method of the power converter device (10), the voltage loop gain is calculated from the estimated capacitance (C) of the smoothing capacitor (14), and the pulse width modulation control signal is generated based on the calculated voltage loop gain. It is therefore possible to control the voltage of the smoothing capacitor (14) appropriately even if the capacitance (C) of the smoothing capacitor (14) varies.

The control method of the power converter device (10) may further include an output step (S8) of outputting an abnormality signal when a determination that the voltage loop gain is not within a given range is made. It is then possible to give an operator a chance for replacing the smoothing capacitor (14).

The capacitance estimating step (S1) may estimate the capacitance (C) until a determination that the voltage loop gain is within the given range is made, until the determination that the voltage loop gain is not within the given range is made a given number of times, and the output step (S8) may output the abnormality signal when the determination that the voltage loop gain is not within the given range has been made the given number of times. It is then possible to suppress output of the abnormality signal when a voltage loop gain outside the given range is calculated due to an accidental factor and the like.

The pulse width modulation control step (S6) may stop control of the rectifier (12) that is based on the pulse width modulation control signal, when the determination that the voltage loop gain is not within the given range is made. It is then possible to avoid a state where the rectifier (12) keeps operating unstably.

The calculating step (S2) may calculate the voltage loop gain such that the voltage loop gain becomes smaller as the estimated capacitance (C) is smaller. It is then possible to appropriately control the voltage of the smoothing capacitor (14).

The power converter device (10) may further include a current detecting unit (16, 16A) configured to detect a current flowing from the three-phase alternating-current power supply (P) to the rectifier (12), or a current flowing from the rectifier (12) to the smoothing capacitor (14), and the capacitance estimating step (S1) may estimate the capacitance (C) based on the detected current and the detected voltage, or electric power calculated from the current and the voltage. This facilitates accurate estimation of the capacitance (C).

The voltage loop gain may include: a proportional gain ($K_p$) and an integral gain ($K_i$); or the proportional gain ($K_p$), the integral gain ($K_i$), and a derivative gain ($K_d$).

What is claimed is:

1. A power converter device configured to convert alternating-current power supplied from a three-phase alternating-current power supply into direct-current power, comprising:
   a rectifier configured to convert the alternating-current power into the direct-current power based on a pulse width modulation control signal;
   a voltage detecting unit configured to detect a voltage of a smoothing capacitor that is connected on a direct-current side of the rectifier;
   a capacitance estimating unit configured to estimate capacitance of the smoothing capacitor;
   a voltage control unit configured to calculate a voltage loop gain from the estimated capacitance and generate a control voltage from the voltage loop gain and an error between a command voltage and the detected voltage; and
   a pulse width modulation control unit configured to generate the pulse width modulation control signal by using the control voltage and control the rectifier.

2. The power converter device according to claim 1, wherein the voltage control unit is configured to output an abnormality signal when the voltage control unit determines that the voltage loop gain is not within a given range.

3. The power converter device according to claim 2, wherein:
   the capacitance estimating unit is configured to estimate the capacitance until the voltage control unit determines that the voltage loop gain is within the given range, until a determination that the voltage loop gain is not within the given range is made a given number of times by the voltage control unit; and
   the voltage control unit is configured to output the abnormality signal when the determination that the voltage loop gain is not within the given range has been made the given number of times by the voltage control unit.

4. The power converter device according to claim 2, wherein the pulse width modulation control unit is configured to stop control of the rectifier that is based on the pulse width modulation control signal, when the voltage control unit determines that the voltage loop gain is not within the given range.

5. The power converter device according to claim 1, wherein the voltage control unit is configured to calculate the voltage loop gain so that the voltage loop gain becomes smaller as the estimated capacitance is smaller.

6. The power converter device according to claim 1, further comprising a current detecting unit configured to detect a current flowing from the three-phase alternating-current power supply to the rectifier, or a current flowing from the rectifier to the smoothing capacitor,
   wherein the capacitance estimating unit is configured to estimate the capacitance based on the detected current and the detected voltage, or electric power calculated from the current and the voltage.

7. The power converter device according to claim 1, wherein the voltage loop gain includes: a proportional gain and an integral gain; or the proportional gain, the integral gain, and a derivative gain.

8. A control method of a power converter device that is configured to convert alternating-current power supplied from a three-phase alternating-current power supply into direct-current power, wherein the power converter device comprises:
a rectifier configured to convert the alternating-current power into the direct-current power based on a pulse width modulation control signal; and
a voltage detecting unit configured to detect a voltage of a smoothing capacitor that is connected on a direct-current side of the rectifier,
the control method comprising:
a capacitance estimating step of estimating capacitance of the smoothing capacitor;
a calculating step of calculating a voltage loop gain from the estimated capacitance;
a generating step of generating a control voltage from the voltage loop gain and an error between a command voltage and the detected voltage; and
a pulse width modulation control step of generating the pulse width modulation control signal by using the control voltage and controlling the rectifier.

9. The control method of the power converter device according to claim 8, further comprising an output step of outputting an abnormality signal when a determination that the voltage loop gain is not within a given range is made.

10. The control method of the power converter device according to claim 9, wherein:
the capacitance estimating step estimates the capacitance until a determination that the voltage loop gain is within the given range is made, until a determination that the voltage loop gain is not within the given range is made a given number of times; and
the output step outputs the abnormality signal when the determination that the voltage loop gain is not within the given range has been made the given number of times.

11. The control method of the power converter device according to claim 9, wherein the pulse width modulation control step stops control of the rectifier that is based on the pulse width modulation control signal, when the determination that the voltage loop gain is not within the given range is made.

12. The control method of the power converter device according to claim 8, wherein the calculating step calculates the voltage loop gain so that the voltage loop gain becomes smaller as the estimated capacitance is smaller.

13. The control method of the power converter device according to claim 8, wherein:
the power converter device further comprises a current detecting unit configured to detect a current flowing from the three-phase alternating-current power supply to the rectifier, or a current flowing from the rectifier to the smoothing capacitor; and
the capacitance estimating step estimates the capacitance based on the detected current and the detected voltage, or electric power calculated from the current and the voltage.

14. The control method of the power converter device according to claim 8, wherein the voltage loop gain includes: a proportional gain and an integral gain; or the proportional gain, the integral gain, and a derivative gain.

* * * * *